(12) United States Patent
Lin et al.

(10) Patent No.: US 7,368,970 B2
(45) Date of Patent: May 6, 2008

(54) LEVEL SHIFTER CIRCUIT

(75) Inventors: Meng-Jyh Lin, Hsin Chu (TW);
Ming-Zhe Liu, Hsin Tien (TW)

(73) Assignee: Sunplus Technology Co., Ltd., Hsin-Chu (TW)

( * ) Notice: Subject to any disclaimer, the term of this patent is extended or adjusted under 35 U.S.C. 154(b) by 0 days.

(21) Appl. No.: 11/455,711

(22) Filed: Jun. 20, 2006

(65) Prior Publication Data

US 2007/0001740 A1    Jan. 4, 2007

(30) Foreign Application Priority Data

Jun. 29, 2005   (TW) .............................. 94121762 A

(51) Int. Cl.
*H03L 5/00*   (2006.01)

(52) U.S. Cl. ........................... 327/333; 326/81; 326/62

(58) Field of Classification Search ................ 327/306, 327/333; 365/189.05; 326/80–81, 62–63
See application file for complete search history.

(56) References Cited

U.S. PATENT DOCUMENTS

| | | | |
|---|---|---|---|
| 6,600,358 B1 | 7/2003 | Chan | |
| 6,617,902 B2 * | 9/2003 | Tokumasu et al. | 327/211 |
| 6,717,453 B2 * | 4/2004 | Aoki | 327/333 |
| 6,750,696 B2 * | 6/2004 | Shimada et al. | 327/333 |
| 6,762,957 B2 * | 7/2004 | Hsu et al. | 365/189.05 |
| 6,819,159 B1 | 11/2004 | Lencioni | |
| 6,842,043 B1 | 1/2005 | Nguyen et al. | |
| 7,091,748 B2 * | 8/2006 | Wada | 326/81 |

* cited by examiner

*Primary Examiner*—Dinh T. Le
(74) *Attorney, Agent, or Firm*—Muncy, Geissler, Olds & Lowe, PLLC

(57) ABSTRACT

A level shifter circuit includes a level shifter unit and a latch unit. The level shifter unit receives two complementary input signals and converts the voltage levels of two complementary input signals. The latch unit latches the state of two output nodes before the low voltage supply is turned off. On condition that the low voltage supply is off, the level shifter circuit avoids current drainage and ensures the voltage level of the output. The invention has the advantages of small circuit size and being easy to design.

6 Claims, 7 Drawing Sheets

US 7,368,970 B2

LEVEL SHIFTER CIRCUIT

BACKGROUND OF THE INVENTION

1. Field of the Invention

The invention relates to an integrated circuit, and in particular, to a level shift circuit with the function of latching the state of an output node before the low voltage supply is off.

2. Description of the Related Art

For saving power, some of integrated circuits are operated at two different voltage levels or power domains. For instance, the circuits in the core of a integrated circuit often operates at a lower voltage (VDDL) of 3.3V than input/output circuits operating at a voltage (VDDH) of 5V in order to reduce power consumption and to enable the use of smaller transistors, thereby reducing the overall die size. Therefore, the integrated circuits frequently use level shifter circuits to adjust the voltage of the input signal so as to be correctly interpreted in the new power domain operating at a higher or lower voltage level.

FIG. 1 is a circuit diagram of a prior art level shifter circuit. Referring to FIG. 1, a level shifter circuit 100 includes an input unit 11, a level shifting unit 12 and an output unit 13. The voltage level (VDDL) of a first power supply provided for the input unit 11 is lower than the voltage level (VDDH) of a second power supply provided for the level shifting unit 12 and the output unit 13. After receiving a front-end input signal INP, the input unit 11 generates an input signal IN and a complementary input signal XIN. To save the power consumption, the first power source operating at a low voltage level is shut off. After the first power source is shut off, the voltages of the gates of both N-channel transistors 105 and 107 are dropped below the threshold voltage $V_t$ such that the N-channel transistors 105 and 107 are shut off and the output node 112 and the complementary output node 111 are floated. In the worst case, the nodes 111 and 112 could float to the voltage of VDDH/2, thereby causing a static current drain through the inverters 108 and 109 in the output unit 13.

Because only one of both nodes 111 and 112 can be pulled to VDDH by using two P-channel transistors 104 and 106, the other node stays at the voltage of VDDH/2 for lack of a leaking path to the ground so that the P-channel and N-channel transistors of inverters 108 and 109 are simultaneously turned ON and there is a static current drain through the second power supply operating at a high voltage. Besides, the voltage of the output terminal 110 becomes indeterminable, which may result in errors of the following stages.

FIG. 2 is a circuit diagram of another prior art level shifter circuit. Referring to FIG. 2, a level shifter circuit 200 also includes an input unit 11, a level shifting unit 22 and an output unit 13. Additionally, in the level shifting unit 22, two P-channel transistors 204 and 206 are inserted to the original level shifting unit 12 in FIG. 1, allowing nodes 111 and 112 to pull down more quickly. As mentioned above, when the first power source operating at a low voltage is turned off, N-channel transistors 105 and 107 are dropped below the threshold voltage $V_t$ such that the N-channel transistors 105 and 107 are shut off and P-channel transistors 204 and 206 are turned on. As regards other situations, nodes 111 and 112 may float just like FIG. 1. If the voltage of the nodes 111 and 112 is staying at VDDH/2, there is a static current drain through the second power supply operating at a high voltage and the voltage of the output terminal 110 becomes indeterminable.

FIG. 3 is a circuit diagram of still another prior art level shifter circuit. In U.S. Pat. No. 6,600,358, Chan discloses a level shifter circuit 300 as shown in FIG. 3, which includes a low voltage detector 320 for detecting the low voltage supply, and eliminates the current drain when the low voltage supply is off. When the low voltage supply is turned off, the input terminal 101 is isolated from the output terminal 110 to avoid the current drain caused by a floating of the gate. However, after the low voltage supply is turned off, the output terminal 110 of the level shifter circuit 300 is fixed at a certain voltage level, but not maintained at a state right before the low voltage supply was turned off. Besides, a lot of transistors are required in the low voltage detector 320. Meanwhile, the number of transistors in the low voltage detector 320 is increased as the voltage difference between two different power domains become larger, so that more stages are necessary for detecting the low voltage supply. Further, the circuit layout size of the level shifter circuit 300 is larger than those of conventional level shifter circuits.

FIG. 4 is a circuit diagram of another prior art level shifter circuit. In U.S. Pat. No. 6,819,159, Lencioni discloses a level shifter circuit 400 as shown in FIG. 4, which includes two level shifters 430 and 440 and two transistors 405 and 407. Two transistors 405 and 407 are used to improve the pull-down speed of the output terminal 110 in the level shifter circuit 400. When the first power supply is turned off, if the two level shifters 430 and 440 match with each other, two transistors 405 and 407 are used as a leaking path to the ground for both the complementary output node 111 and the output node 112, and there is no static current drain. However, owing to including two level shifters 430 and 440, the level shifter circuit 400 occupies a larger circuit size than conventional level shift circuits do. Also, the circuit layouts of the two level shifters 430 and 440 necessarily match each other, thereby increasing the complexity of circuit design.

Conventional level shifter circuits are numerous. However, the primary object of a level shifter circuit is to correctly adjust the voltage level of the input signal. Thereby, when the low voltage supply is turned off, it is important that there are no static current drain and a definite voltage level of the output terminal in a practical level shifter circuit, which should be small in layout size and easy in circuit design.

SUMMARY OF THE INVENTION

In view of the above-mentioned problems, an object of the invention is to provide a level shifter circuit to latch the previous state of an output node if the low voltage supply is turned off.

To achieve the above-mentioned object, the level shifter circuit converts both an input signal and a complementary input signal powered by a first power supply into an output signal powered by a second power supply. The level shifter circuit comprises a level shifting unit and a latch unit. After receiving the input signal and the complementary input signal, the level shifting unit powered by the second power supply and having an output node and a complementary output node outputs the output signal. The latch unit, which is powered by the second power supply and is connected to the output node, the complementary output node and a ground terminal, latches the previous states of the output node and the complementary output node if the first power supply is switched off.

Comparing with conventional level shifter circuits, the invention solves the current drainage when the low voltage supply is turned off, by just adding two N-channel transistors. With the minimum circuit size increment, the aim of saving the power consumption is achieved. Moreover, the output voltage is held at a voltage level right before the low voltage supply was turned off so that the following stages can operate normally.

DETAILED DESCRIPTION OF THE INVENTION

The level shifter circuit of the invention will be described with reference to the accompanying drawings.

Figure 1:
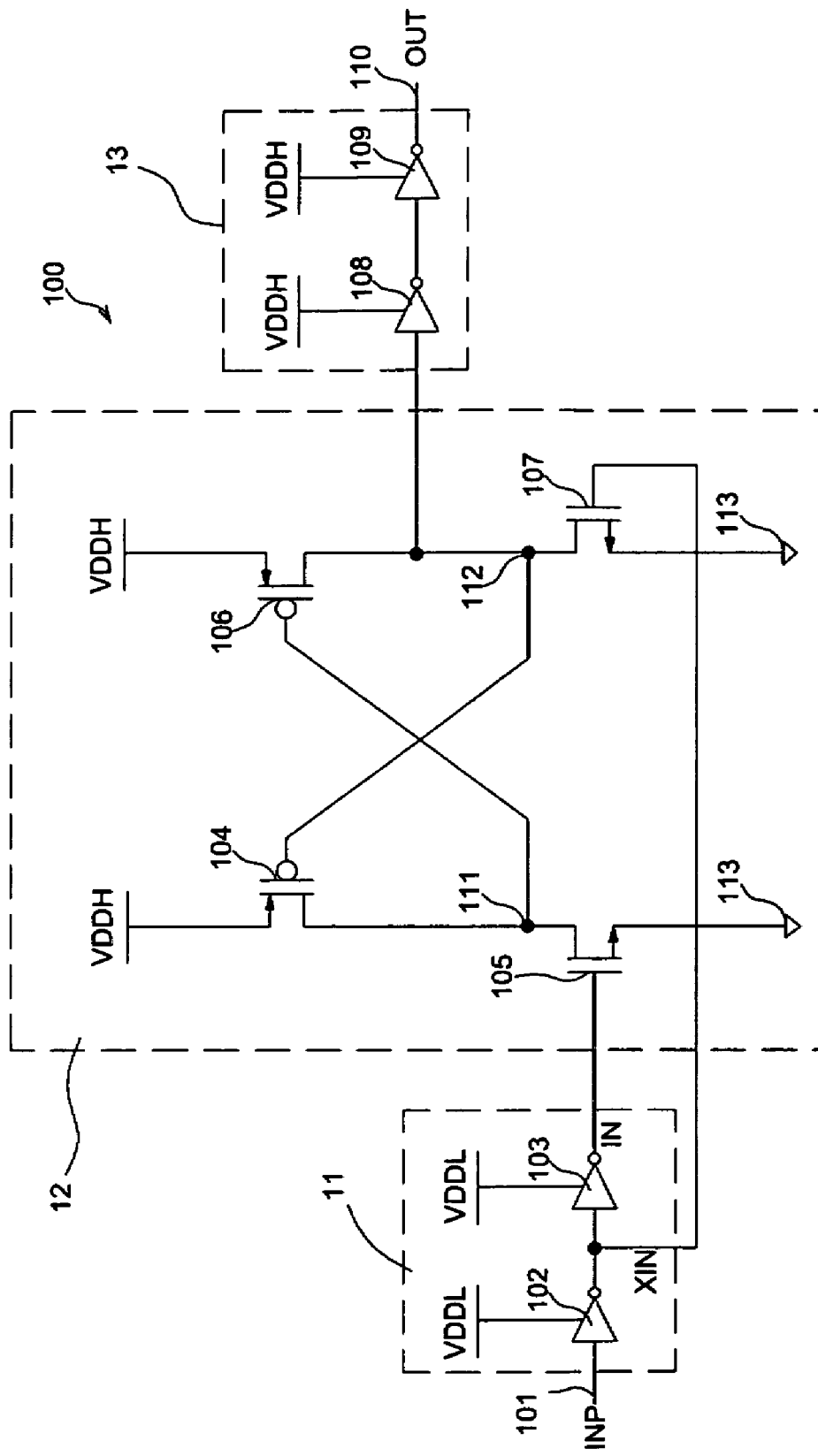
FIG. 1 is a circuit diagram of a prior art level shifter circuit.
Figure 2:
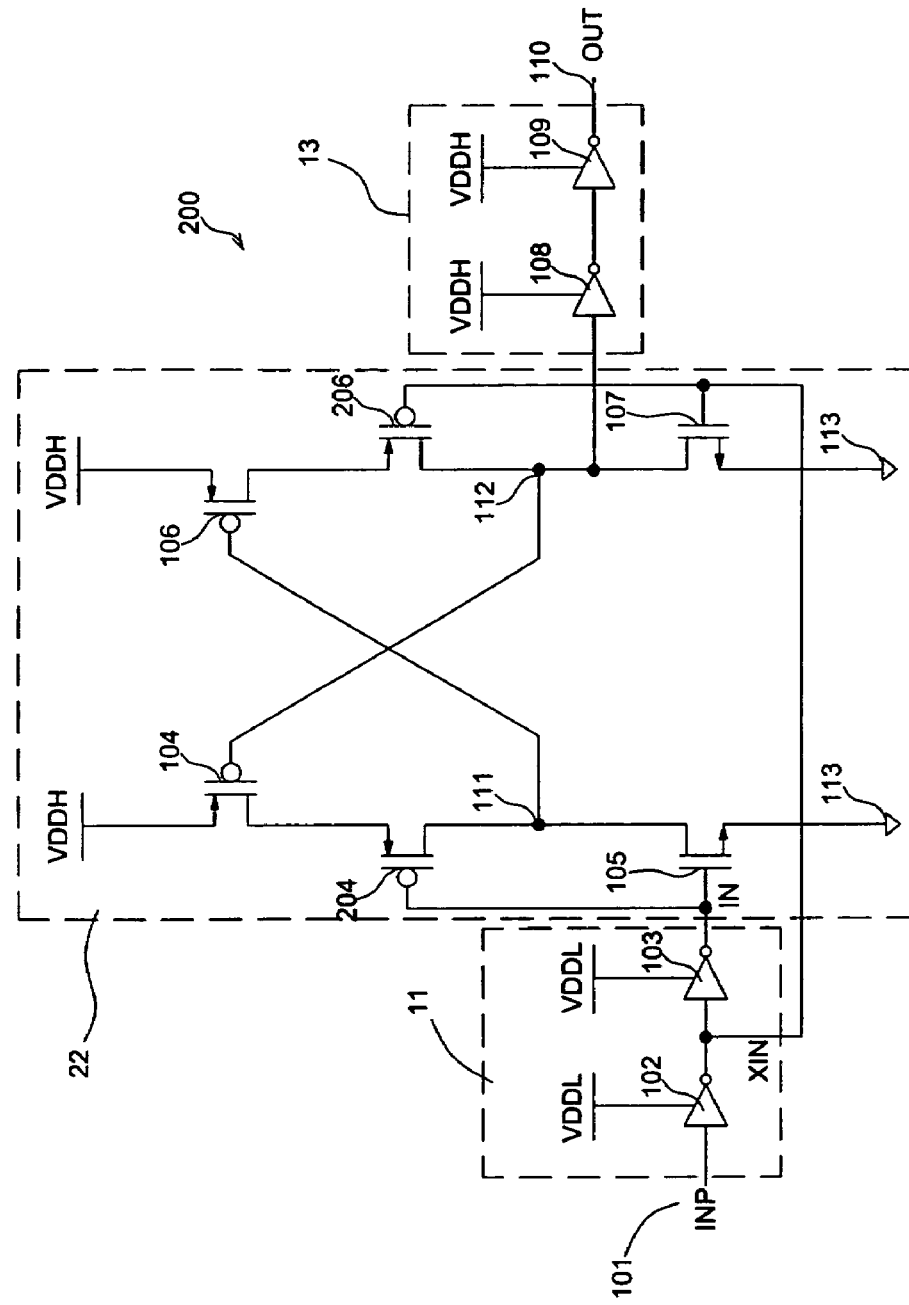
FIG. 2 is a circuit diagram of another prior art level shifter circuit.
Figure 3:
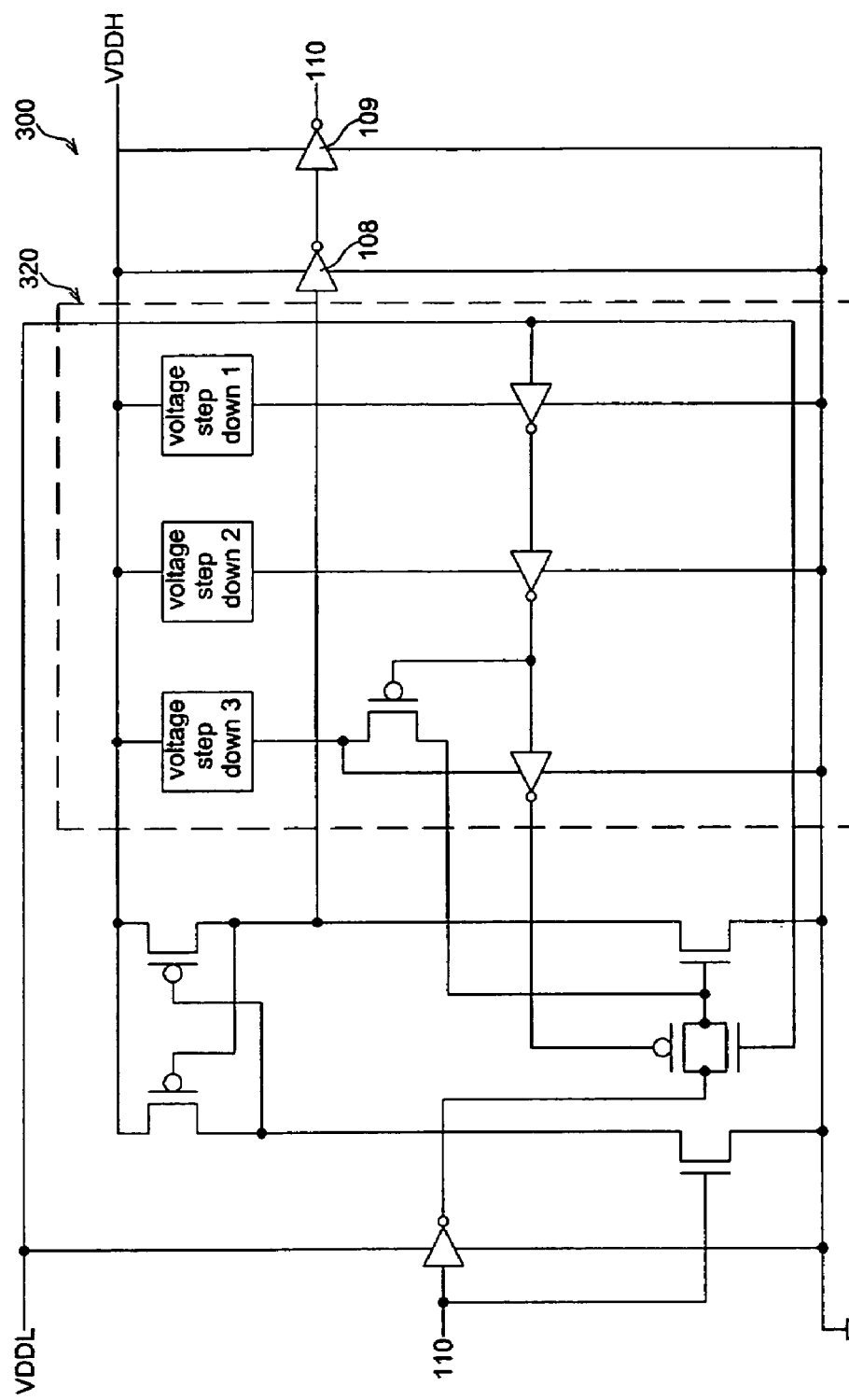
FIG. 3 is a circuit diagram of another prior art level shifter circuit.
Figure 4:
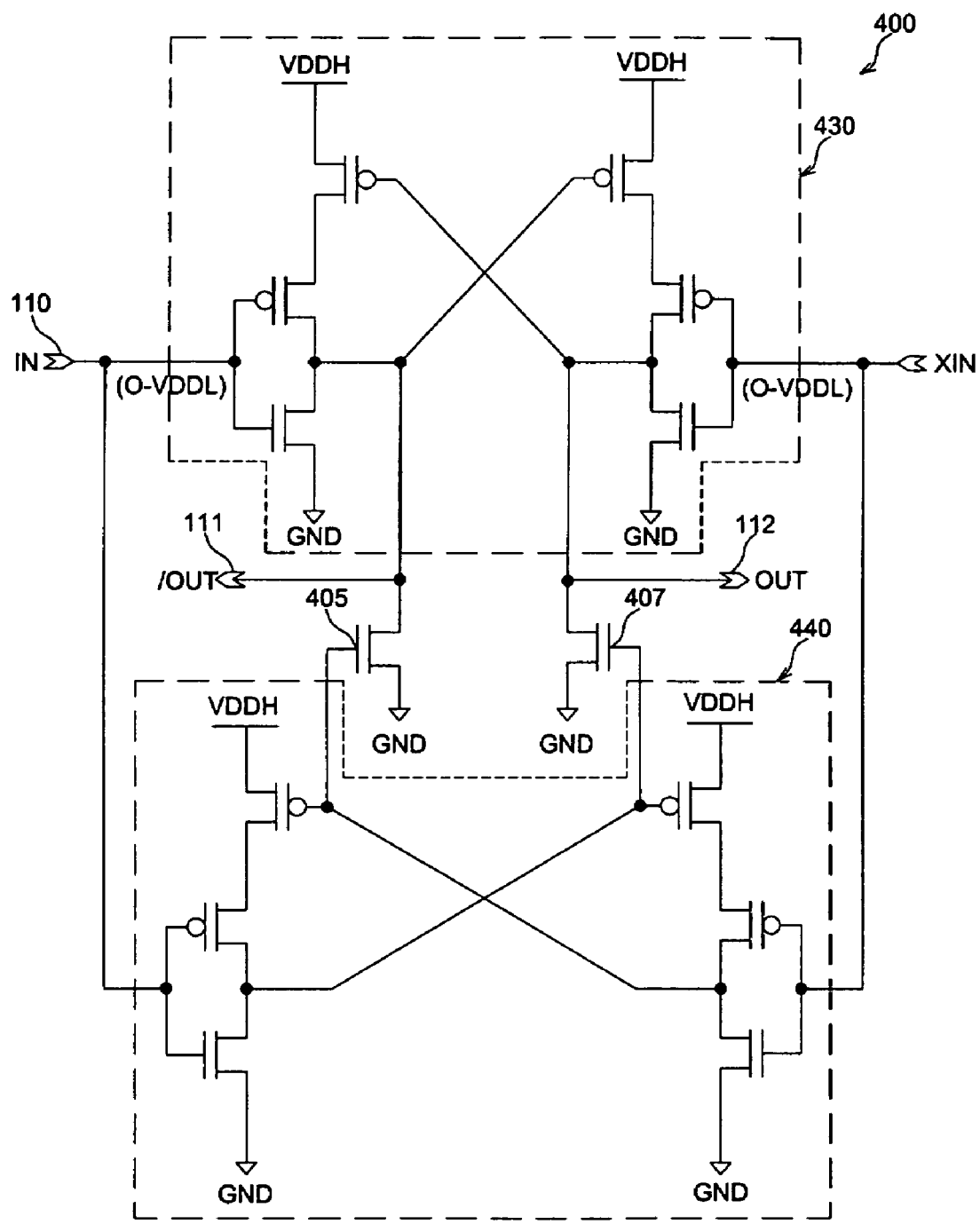
FIG. 4 is a circuit diagram of another prior art level shifter circuit.
Figure 5:
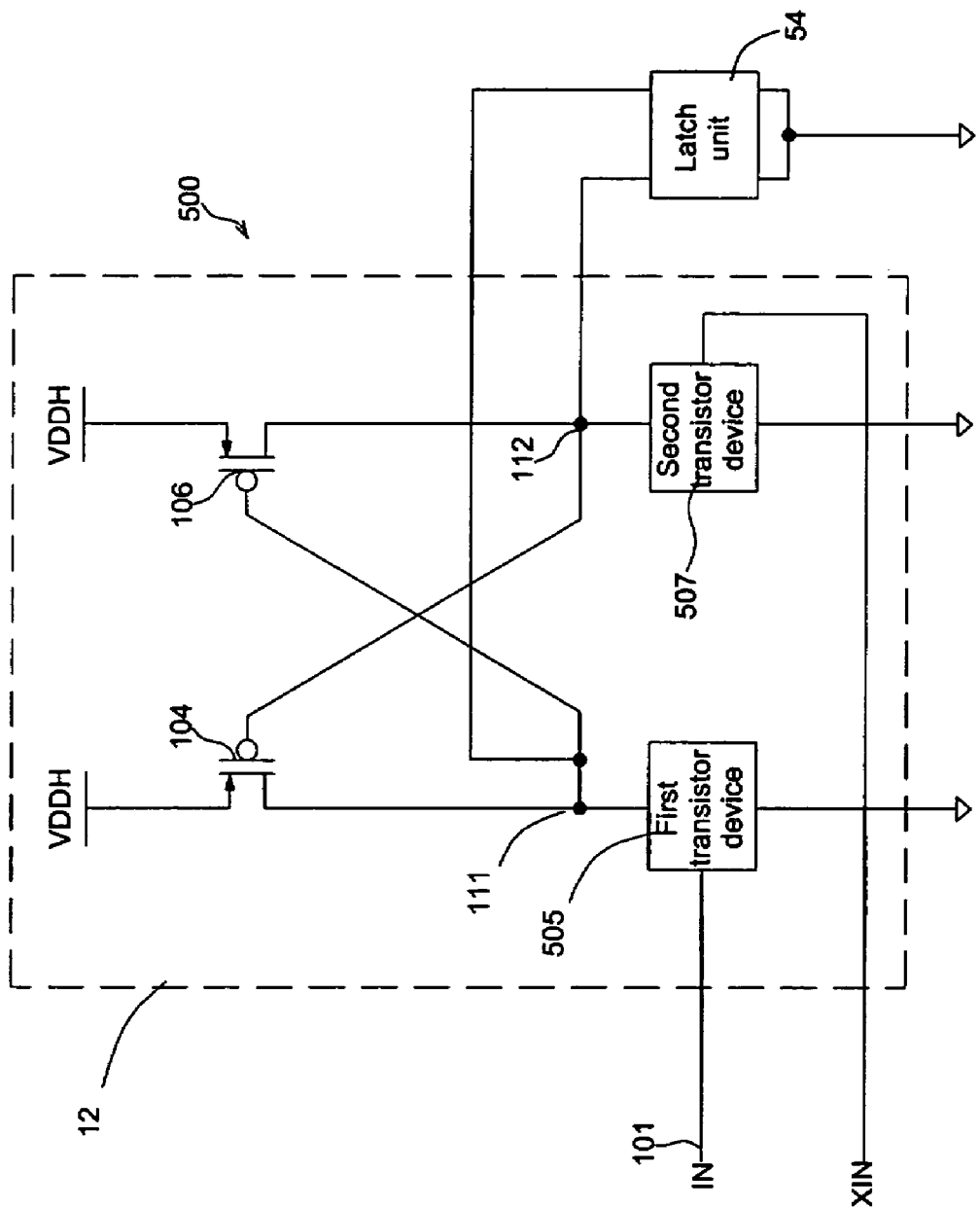
FIG. 5 is a circuit diagram of a level shifter circuit according to the invention.

FIG. 5 is a circuit diagram of a level shifter circuit according to the invention. Referring now to FIG. 5, the level shifter circuit 500 includes a level shifting unit 12 and a latch unit 54 according to the invention. The level shifting unit 12 converts two complementary input signals (i.e. an input signal IN and a complementary input signal XIN) having a voltage amplitude ranging from 0 to VDDL into an output signal having a voltage amplitude ranging from 0 to VDDH. Wherein, the two complementary input signals IN and XIN are powered by a first power supply operating at a low voltage while both the level shifting unit 12 and the latch unit 54 are powered by a second power supply operating at a high voltage. The latch unit 54 latches the previous states of the output node 112 and the complementary output node 111 if the first power supply is turned off.

The level shifting unit 12 includes a first P-channel transistor 104, a second P-channel transistor 106 a first transistor device 505 and a second transistor device 507. The latch unit 54 is connected to the output node 112, the complementary output node 111 and a ground terminal 113.

The first P-channel transistor 104 and the second P-channel transistor 106 are respectively connected to the second power supply. The first transistor device 505 receives the input signal IN, and is connected to the drain of the first P-channel transistor 104, the gate of the second P-channel transistor 106 and the latch unit 54. The second transistor device 507 receives the complementary input signal XIN, and is connected to the gate of the first P-channel transistor 104, the drain of the second P-channel transistor 106 and the latch unit 54.

Figure 6:
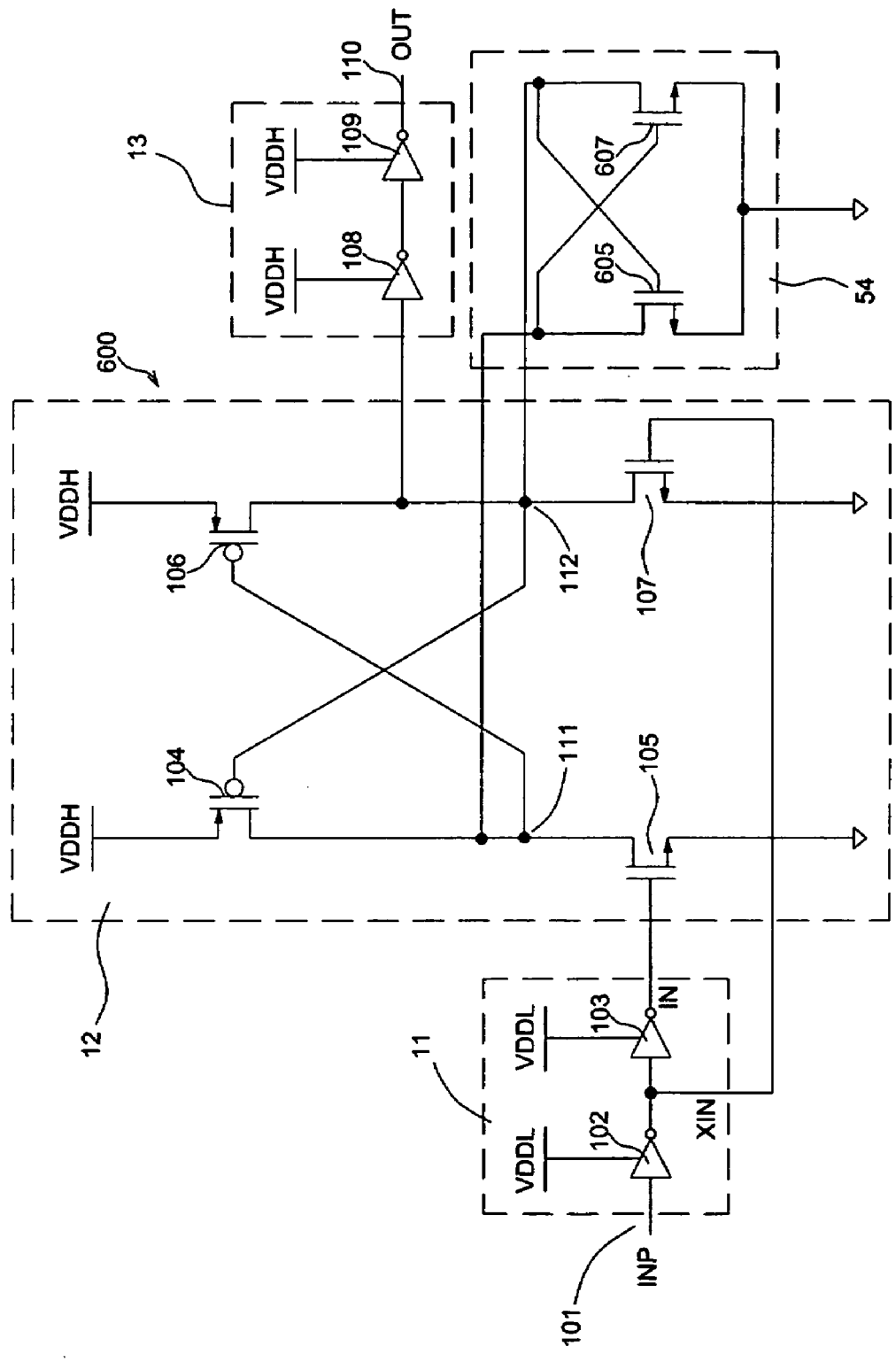
FIG. 6 is a circuit diagram of a level shifter circuit according to a first embodiment of the invention.

FIG. 6 is a circuit diagram of a level shifter circuit according to a first embodiment of the invention. Referring to FIG. 6, the level shifter circuit 600 includes an input unit 11, a level shifting unit 12, an output unit 13 and a latch unit 54 according to the first embodiment of the invention. The input unit 11 is powered by the first power supply operating at a low voltage VDDL. The level shifting unit 12, the output unit 13 and the latch unit 54 are powered by the second power supply operating at a high voltage VDDH, which voltage is higher than the voltage of the first power supply.

The input unit 11, as well as conventional level shifter circuits, also includes two inverters 102, 103 in series. The first inverter 102 receives the front-end input signal INP and then generates the complementary input signal XIN while the second inverter 103 receives the complementary input signal XIN and then generates the input signal IN. The output unit 13, as well as conventional level shifter circuits, also includes two inverters 108, 109 in series. The inverters 102, 103, 108 and 109 can be implemented by using a complementary transistor pair made up of a N-channel transistor and a P-channel transistor.

In this embodiment, the first and the second transistor devices are implemented by using N-channel transistor 105 and 107 respectively. Therefore, the level shifting unit 12 includes a first P-channel transistor 104, a second P-channel transistor 106 and two N-channel transistors 105 and 107. The latch unit 54 includes two N-channel transistors 605 and 607. The N-channel transistor 605 has a drain connected to the complementary output node 111, a gate connected to the output node 112 and a source connected to ground. The N-channel transistor 607 has a drain connected to the output node 112, a gate connected to the complementary output node 111 and a source connected to ground.

When the first voltage VDDL is turned on, if the electric potential of the input signal IN is at a logic high of voltage VDDL and the electric potential of the complementary input signal XIN is at a logic low of GND, the N-channel transistor 105 is turned on and the complementary output node 111 is pulled down to a logic low of GND. Next, the second P-channel transistor 106 is turned on, and then the output node 112 is pulled up to a logic high of voltage VDDH so as to switch the N-channel transistor 605 on and improve the pull-down speed of the complementary output node 111. On the other hand, if the electric potential of the input signal IN is at a logic low of GND and the electric potential of the complementary input signal XIN is at a logic high of voltage VDDL, the N-channel transistor 107 is turned on and then the output node 112 is pulled down to a logic low of GND. Next, the first P-channel transistor 104 is turned on, and then the complementary output node 111 is pulled to a logic high of voltage VDDH so as to switch the N-channel transistor 607 on and improve the pull-down speed of the output node 112. Thus, the level shifter circuit 600 including the latch unit 54 reduces the falling time of the complementary output node 111 and the output node 112, thereby, effectively increasing the maximum operating frequency of the level shifter circuit 600.

Suppose that the complementary output node 111 and the output node 112 are at a logic low and a logic high respectively before the first power supply is turned off. After the first power supply is turned off for lowering the power consumption, the voltages of the gates of both N-channel transistors 105 and 107 are dropped below the threshold voltage $V_t$ so that the N-channel transistors 105 and 107 are shut off. At this time, the N-channel transistor 605 is turned ON and serves as a leaking path from the complementary output node 111 to the ground. Meanwhile, the second P-channel transistor 106 is also turned on and serves as a charging path from the output node 112 to the second power supply. Therefore, in turn, the complementary output node 111 and the output node 112 stay at a logic low and a logic high respectively.

On the other hand, suppose that the complementary output node 111 and the output node 112 are at a logic high and a logic low respectively before the first power supply is turned off. After the first power supply is turned off, the N-channel transistor 607 is turned on and serves as a leaking path from the output node 112 to the ground. Meanwhile, the first P-channel transistor 104 is also turned on and serves as a charging path from the complementary output node 111 to the second power supply. Therefore, the complementary output node 111 and the output node 112 stay at a logic high and a logic low respectively.

Because the level shifter circuit 600 includes the latch unit 54, the electric potentials of the complementary output node 111 and the output node 112 can be swiftly pulled to VDDH or GND, and be latched before the first power supply is off. Hence, the following stages can operate normally even after the first power supply is turned off. The level shifter circuit of the present invention solves the current drainage problem caused by the floating output nodes 111, 112 at the inputs of inverters 108 and 109 in conventional level shifter circuits. Further, the aim of saving the power consumption by turning off the first power supply is achieved with the minimum circuit size increment.

Figure 7:
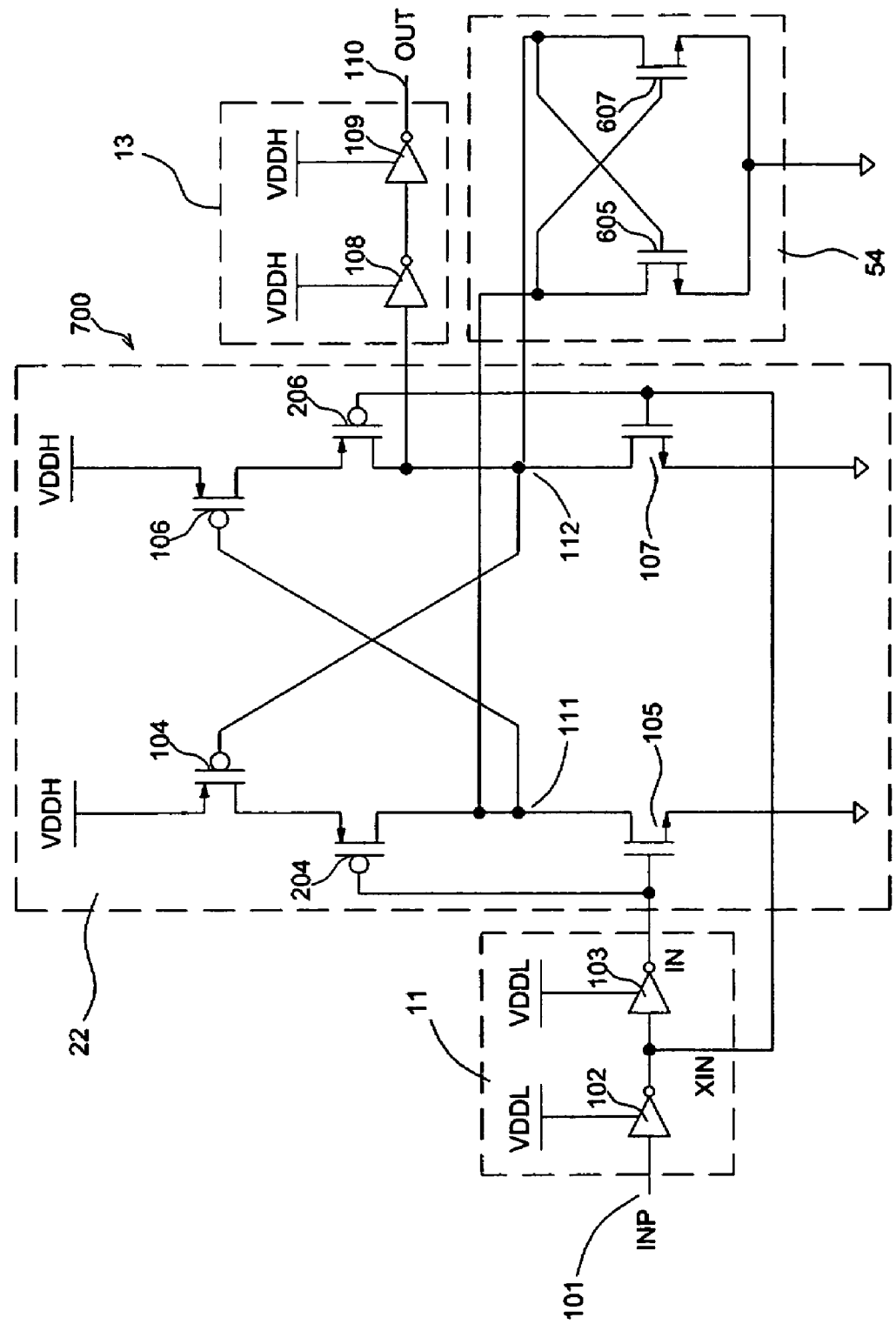
FIG. 7 is a circuit diagram of a level shifter circuit according to a second embodiment of the invention.

FIG. 7 is a circuit diagram of a level shifter circuit according to a second embodiment of the invention. With reference now to FIG. 7, the level shifter circuit 700 includes an input unit 11, a level shifting unit 22, an output unit 13 and a latch unit 54 according to the second embodiment of the invention. The first transistor device of the level shifting unit 22 is implemented by using a complementary transistor pair made up of a N-channel transistor 105 and a P-channel transistor 204 while the second transistor device is implemented by using a complementary transistor pair made up of a N-channel transistor 107 and a P-channel transistor 206. Thus, the level shifting unit 22 includes a first P-channel transistor 104, a second P-channel transistor 106, two N-channel transistors 105 and 107 and two P-channel transistors 204 and 206. The output terminal of the complementary transistor pair 105 and 204 is electrically connected to both the gates of the second P-channel transistor 106 and N-channel transistor 607 via the complementary output node 111. The output terminal of the complementary transistor pair 107 and 206 is electrically connected to both the gates of the first P-channel transistor 106 and N-channel transistor 605 via the output node 112.

Compared with the level shifter circuit 600 of the first embodiment, the level shifter circuit 700 is additionally inserted two P-channel transistors 204 and 206, which achieves the effect of improving the pull-down speed of the output node 111 and 112. Because the other circuits in the second embodiment are the same as the first embodiment, the description is omitted.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. A level shifter circuit for converting both an input signal and a complementary input signal powered by a first power supply into an output signal powered by a second power supply, comprising:

a level shifting unit, comprising:
a first P-channel transistor having a first source connected to the second power supply and a first gate connected to the output node;
a second P-channel transistor having a second source connected to the second power supply and a second gate connected to the complementary output node;
a third P-channel transistor having a third source connected to the first drain of the first P-channel transistor, a third drain defined as the complementary output node and a third gate receiving the input signal;
a fourth P-channel transistor having a fourth source connected to the second drain of the second P-channel transistor, a fourth drain defined as the output node and a fourth gate receiving the complementary input signal;
a first N-channel transistor having a fifth drain connected to the complementary output node, a fifth gate receiving the input signal and a fifth source connected to the ground terminal; and
a second N-channel transistor having a sixth drain connected to the output node, a sixth gate receiving the complementary input signal and a sixth source connected to the ground terminal; and
a latch unit powered by the second power supply and connected to the output node, the complementary output node and a ground terminal;
wherein the latch unit latches previous states of the output node and the complementary output node if the first power supply is turned off.

2. The level shifter circuit of claim 1, wherein the latch unit comprises:
a third N-channel transistor having a seventh drain connected to the complementary output node, a seventh gate connected to the output node and a seventh source connected to the ground terminal; and
a fourth N-channel transistor having a eighth drain connected to the output node, a eighth gate connected to the complementary output node and a eighth source connected to the ground terminal.

3. The level shifter circuit of claim 1, further comprising:
an input unit which is powered by the first power supply, and generates the input signal and the complementary input signal after receiving a front-end input signal.

4. The level shifter circuit of claim 3, wherein the input unit comprises:
a first inverter for generating the complementary input signal after receiving the front-end input signal; and
a second inverter which is connected in series to the first inverter and generates the input signal.

5. The level shifter circuit of claim 1, further comprising:
an output unit which is powered by the second power supply, and generates the output signal and a complementary output signal after receiving a signal through the output node.

6. The level shifter of claim 5, wherein the output unit comprises:
a third inverter for generating the complementary output signal after receiving the signal through the output node; and
a fourth inverter which is connected in series to the third inverter and generates the output signal.

* * * * *